United States Patent
Kozasa et al.

(10) Patent No.: US 8,696,809 B2
(45) Date of Patent: Apr. 15, 2014

(54) MANUFACTURING METHOD OF EPITAXIAL SILICON WAFER AND SUBSTRATE CLEANING APPARATUS

(75) Inventors: Kazuaki Kozasa, Omura (JP); Kosuke Miyoshi, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 1277 days.

(21) Appl. No.: 12/137,754

(22) Filed: Jun. 12, 2008

(65) Prior Publication Data

US 2008/0308129 A1    Dec. 18, 2008

(30) Foreign Application Priority Data

Jun. 18, 2007  (JP) .................................. 2007-160100

(51) Int. Cl.
| | | |
|---|---|---|
| C30B 15/00 | (2006.01) | |
| C30B 21/06 | (2006.01) | |
| C30B 27/02 | (2006.01) | |
| C30B 30/04 | (2006.01) | |
| C30B 23/00 | (2006.01) | |
| C30B 25/00 | (2006.01) | |
| C30B 28/12 | (2006.01) | |
| C30B 28/14 | (2006.01) | |
| C30B 35/00 | (2006.01) | |

(52) U.S. Cl.
USPC .................... 117/13; 117/19; 117/26; 117/90; 117/200

(58) Field of Classification Search
USPC .................................. 117/13, 19, 26, 90, 200
See application file for complete search history.

(56) References Cited

U.S. PATENT DOCUMENTS

| | | | | |
|---|---|---|---|---|
| 6,471,783 | B1* | 10/2002 | Gotoh et al. ....................... 134/3 |
| 7,524,771 | B2* | 4/2009 | Izumi et al. .................. 438/745 |
| 2002/0068459 | A1 | 6/2002 | Mochizuki | |
| 2006/0150894 | A1* | 7/2006 | Kobayashi ...................... 117/84 |

FOREIGN PATENT DOCUMENTS

| | | |
|---|---|---|
| JP | 62-173720 A | 7/1987 |
| JP | 08-322777 A | 12/1996 |
| JP | 11-330583 A | 11/1999 |
| JP | 2001-274167 A | 10/2001 |
| JP | 2002-020200 A | 1/2002 |
| JP | 2002-118091 A | 4/2002 |
| JP | 2002-154891 A | 5/2002 |
| JP | 2002-353149 A | 12/2002 |

(Continued)

OTHER PUBLICATIONS

Japanese Office Action dated Oct. 4, 2011 (and English translation thereof) in counterpart Japanese Application No. 2007-160100.
Japanese Office Action dated May 8, 2012 (and English translation thereof) in counterpart Japanese Application No. 2007-160100.

(Continued)

*Primary Examiner* — James McDonough
(74) *Attorney, Agent, or Firm* — Holtz, Holtz, Goodman & Chick, PC

(57) ABSTRACT

A manufacturing method of an epitaxial silicon wafer is provided. The epitaxial silicon wafer includes: a substrate cut out from a silicon monocrystal that has been manufactured, doped with nitrogen and pulled up in accordance with Czochralski method; and an epitaxial layer formed on the substrate. The manufacturing method includes: cleaning a surface of the substrate with fluorinated acid by spraying onto the surface of the substrate fluorinated acid vaporized by a bubbling tank of a substrate cleaning apparatus; and forming an epitaxial layer on the cleaned surface of the substrate.

1 Claim, 3 Drawing Sheets

(56) References Cited

FOREIGN PATENT DOCUMENTS

| | | |
|---|---|---|
| JP | 2003-073191 A | 3/2003 |
| JP | 2003-243404 A | 8/2003 |
| JP | 2005-064406 A | 3/2005 |
| JP | 2005-142461 A | 6/2005 |
| JP | 2006-004983 A | 1/2006 |
| JP | 2006-179831 A | 7/2006 |

OTHER PUBLICATIONS

Japanese Office Action dated Dec. 4, 2012 (and English translation thereof) in counterpart Japanese Application No. 2007-160100.

* cited by examiner

INNER WALL OXIDE FILM (BUMP)

⇩ PROCESS OF CLEANING WITH FLUORINATED ACID

⇩ H₂ BAKE TREATMENT

⇩ PROCESS OF FORMING EPITAXIAL LAYER

MANUFACTURING METHOD OF EPITAXIAL SILICON WAFER AND SUBSTRATE CLEANING APPARATUS

BACKGROUND OF THE INVENTION

1. Field of the Invention

The present invention relates to a manufacturing method of epitaxial silicon wafer(s) and a substrate cleaning apparatus.

2. Description of Related Art

Epitaxial silicon wafers have been conventionally known to have: substrates made of silicon monocrystal; and epitaxial layers formed on surfaces of the substrates.

Since contamination of an epitaxial layer of such an epitaxial silicon wafer with metal impurities may deteriorate device properties, such contamination of the epitaxial layer with metal impurities is eliminated by gettering.

An exemplary method of enhancing gettering capability is to form oxygen precipitation nucleation within a bulk by adding nitrogen to a crystal during pulling-up, trap metal impurities within the oxygen precipitation nucleation, and eliminate the metal impurities.

On a surface of such a nitrogen-doped substrate, COP (crystal originated particle), one of micro defects, is present. An inner wall of the COP is known to be covered with oxide film nitride film.

It has been found that, when an epitaxial layer is further formed on the substrate surface in this state, the oxide film nitride film of the inner wall of the COP causes stacking faults (hereinafter may be abbreviated as SF), which may lead to a defect on a surface of an epitaxial wafer.

In view of such a problem, according to a known technique, a substrate is soaked into a solution of fluorinated acid or a substrate surface is cleaned with a solution of fluorinated acid before an epitaxial layer is formed (see, for instance, Document 1: JP-A-2002-20200).

According to another known technique, a substrate is pre-annealed before an epitaxial layer is formed (see, for instance, Document 2: JP-A-2003-73191).

However, the cleaning of the substrate with the solution of fluorinated acid as disclosed in Document 1 cannot sufficiently eliminate the oxide film.nitride film of the inner wall of the COP, and requires a longer time for cleaning.

In addition, unless precious metal ion within the cleaning solution of fluorinated acid is sufficiently blocked, a difference in electric charge between the precious metal ion and the silicon may cause a defect on the surface.

On the other hand, although the pre-annealing of the substrate before the formation of the epitaxial layer as disclosed in Document 2 is effective to a certain degree, precipitate formed on the surface by heat treating may cause a defect on the surface again.

SUMMARY OF THE INVENTION

An object of the present invention is to provide a manufacturing method of epitaxial silicon wafer(s) and a substrate cleaning apparatus by which gettering capability can be enhanced while stacking faults are prevented even when an epitaxial layer is formed on the substrate surface.

The present invention has been reached based on a finding that, since COP on a surface of a substrate doped with nitrogen is shaped like such a narrow groove that a cleaning solution of fluorinated acid can hardly infiltrate into the groove of the COP as shown in a photograph of FIG. 1 (i.e., the groove of the COP cannot be easily cleaned), oxide film nitride film of an inner wall of the COP cannot be sufficiently eliminated.

Specifically, a manufacturing method of epitaxial silicon wafer(s) according to an aspect of the present invention is a method of manufacturing an epitaxial silicon wafer that includes: a substrate cut out from a silicon monocrystal, the silicon monocrystal being manufactured, doped with nitrogen and pulled up in accordance with Czochralski method; and an epitaxial layer formed on the substrate, the method including: cleaning a surface of the substrate with fluorinated acid by spraying vaporized fluorinated acid onto the surface of the substrate; and forming an epitaxial layer on the cleaned surface of the substrate.

According to the aspect of the present invention, the cleaning of the surface of the substrate with fluorinated acid preferably includes: introducing into a tank an aqueous solution of fluorinated acid a concentration of which has been adjusted; vaporizing the fluorinated acid by bubbling with inactive gas being introduced; and pressurizing and spraying the vaporized fluorinated acid.

The "inactive gas" herein may include not only inactive gas (rare gas) such as argon (Ar) but also any other gas, as long as the gas is not reacted with fluorinated acid, a preferable example of which is nitrogen.

Preferably, a temperature of the inactive gas is in a range of 10 to 100 degrees C.

When the temperature exceeds 100 degrees C., the substrate surface may be etched. On the other hand, the lower limit to the temperature of the inactive gas is not subject to any specific limitations, as long as the temperature is higher than the freezing point of the aqueous solution of fluorinated acid so as not to freeze the aqueous solution of fluorinated acid. The lower limit to the temperature of the inactive gas is preferably 10 degrees or more (i.e., temperature near room temperature) in view of manufacturability, manufacturing cost and the like.

The "bubbling" herein means to form multiple bubbles by injecting the inactive gas into the aqueous solution of fluorinated acid. For instance, by placing a porous material such as a membrane filter in the aqueous solution of fluorinated acid, and then injecting the inactive gas into the membrane filter, multiple fine bubbles can be formed.

According to the aspect of the present invention, by spraying vaporized fluorinated acid onto the substrate surface, the vaporized fluorinated acid can be sufficiently infiltrated into the inner wall of the COP having a narrow groove shape as shown in FIG. 1, thereby effectively cleaning the oxide film-.nitride film formed on the inner wall of the COP.

In addition, when the vaporized fluorinated acid is used for cleaning the substrate surface, precious metal ion, which may be contained in the aqueous solution of fluorinated acid, is not contained in the vaporized fluorinated acid, so that the substrate surface is free from contamination with the precious metal ion. Thus, the defects on the substrate surface due to the contamination with the precious metal ion can be prevented.

A substrate cleaning apparatus according to another aspect of the present invention, which is applicable in the above-described manufacturing method of epitaxial silicon wafer(s), is a substrate cleaning apparatus for cleaning a surface of a silicon wafer with fluorinated acid, the substrate cleaning apparatus including: a bubbling tank internally provided with a membrane filter into which inactive gas is introduced so that fluorinated acid contained in an aqueous solution of fluorinated acid is vaporized; a pressurizing tank that pressurizes the vaporized fluorinated acid; and a nozzle that sprays the vaporized fluorinated acid onto the surface of the silicon wafer substrate.

DETAILED DESCRIPTION OF PREFERRED EMBODIMENT(S)

An exemplary embodiment of the present invention will be described with reference to the attached drawings.

Figure 1:
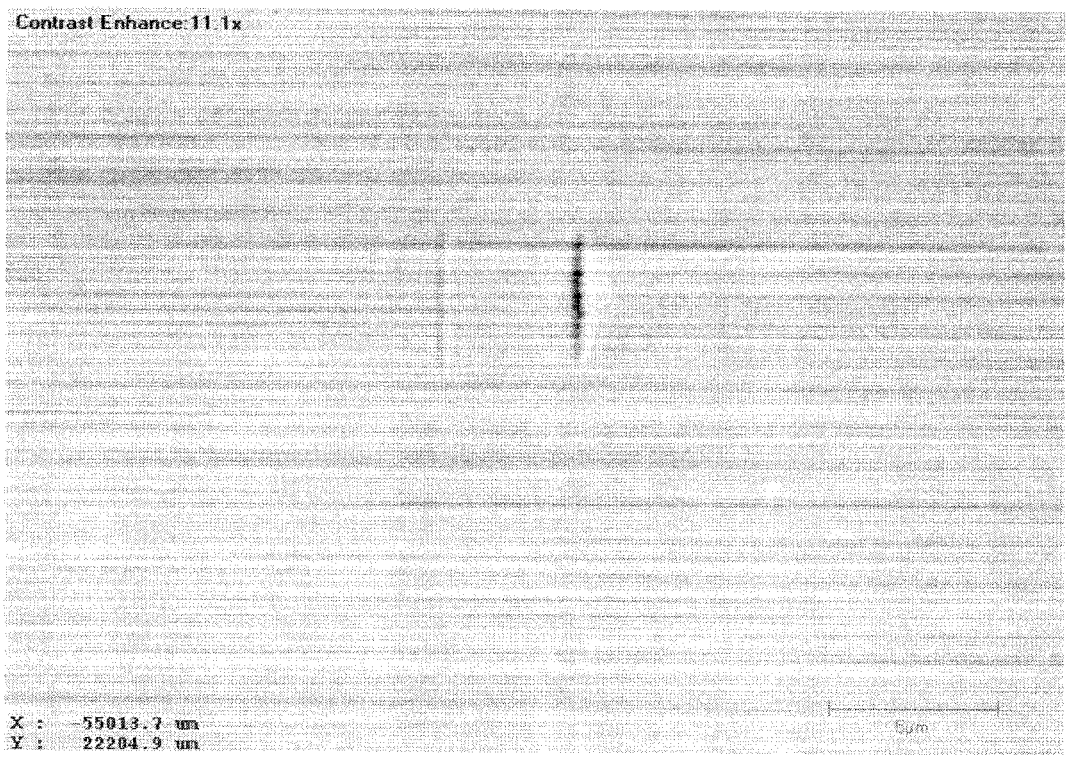
FIG. 1 is a photograph showing COP formed on a surface of a semiconductor wafer according to the present invention.
Figure 2:
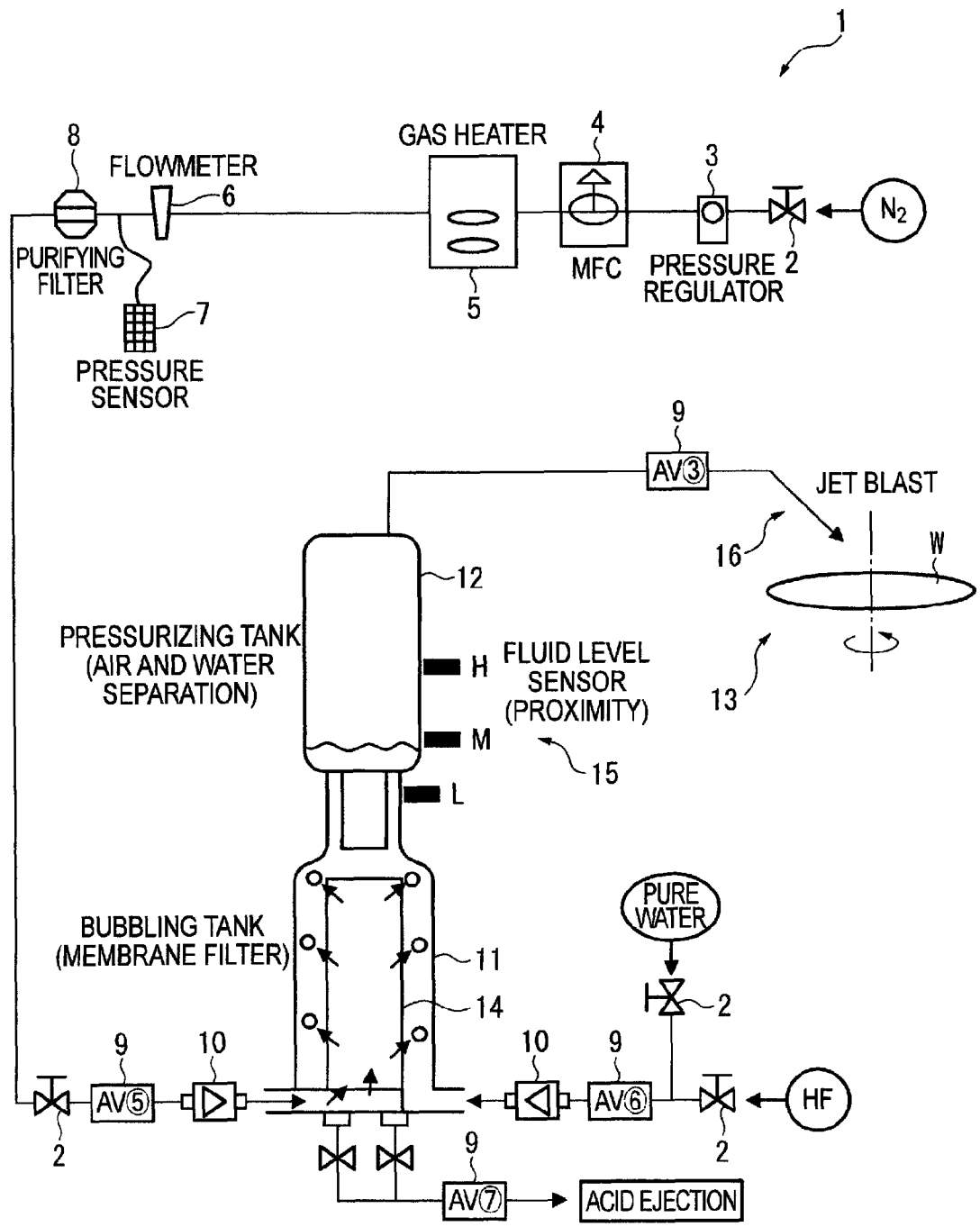
FIG. 2 schematically shows an arrangement of a substrate cleaning apparatus according to an exemplary embodiment of the present invention.

FIG. 2 shows a substrate cleaning apparatus 1 for silicon wafers according to the exemplary embodiment. The substrate cleaning apparatus 1 includes a needle valve 2, a pressure regulator 3, a mass flow controller 4 (hereinafter abbreviated as MFC), a gas heater 5, a flowmeter 6, a pressure sensor 7, a purifying filter 8, an air-operated valve 9, a check valve 10, a bubbling tank 11, a pressurizing tank 12 and a single-wafer spin cleaner 13.

The MFC 4 is a flow control valve for controlling the flow of nitrogen (inactive gas) while the gas heater 5 is a device for adjusting the temperature of nitrogen supplied to the bubbling tank 11 to the temperature of 10 to 100 degrees C.

The flowmeter 6 and the pressure sensor 7 respectively detect the flow and the pressure of nitrogen supplied to the bubbling tank 11, so that the MFC 4 controls the flow of nitrogen based on the detected flow and pressure.

The purifying filter 8 catches grit and dust in nitrogen so as to supply clean nitrogen to the bubbling tank 11.

The bubbling tank 11 is a sealed tank having a membrane filter 14 inside. Aqueous solution of fluorinated acid, the concentration of which has been adjusted by pure water, is introduced into the bubbling tank 11 while nitrogen, the temperature of which has been adjusted by the gas heater 5, is supplied into the membrane filter 14.

When the temperature-adjusted nitrogen is supplied into the bubbling tank 11, the membrane filter 14 generates multiple bubbles so as to vaporize the fluorinated acid contained in the aqueous solution of the fluorinated acid therewith, and the vaporized fluorinated acid is supplied to the pressurizing tank 12.

The pressurizing tank 12, which is a tank for storing the fluorinated acid vaporized by the bubbling tank 11, also separates the vaporized fluorinated acid from the aqueous solution at the same time. In addition, the pressurizing tank 12, which is provided with a fluid level sensor 15, controls an amount of the aqueous solution of fluorinated acid supplied to the bubbling tank 11 based on a detection value of the fluid level sensor 15. When the detection value of the fluid level sensor 15 has reached a "High" level, the air-operated valve 9 is opened so as to eject the acid. On the other hand, when the detection value of the fluid level sensor 15 has reached a "Low" level, the fluorinated acid and pure water are controlled to be supplied thereinto. The pressurizing tank 12 is connected with a nozzle 16 via a plumbing member and the air-operated valve 9.

The nozzle 16 is for spraying the fluorinated acid vaporized by the bubbling tank 11 onto a surface of a wafer substrate W. When spraying the vaporized fluorinated acid, the nozzle 16 uses its rotatable injection head, so that the vaporized fluorinated acid can be uniformly sprayed over the surface of the wafer substrate W.

The single-wafer spin cleaner 13 includes a stage on which the wafer substrate W is mounted and a driver for rotatably driving the stage. By rotating the stage with the wafer substrate W mounted thereon, the cleaning agent supplied on the surface of the wafer substrate W can be spread in a direction toward an outer circumference of the single-wafer spin cleaner 13 due to centrifugal force.

Next, a process for manufacturing an epitaxial silicon wafer using the above-described substrate cleaning apparatus 1 will be described.

Initially, an ingot of a silicon monocrystal is manufactured by supplying nitrogen into a chamber when the silicon monocrystal is pulled up in accordance with Czochralski method.

After the silicon monocrystal is pulled up, the wafer substrate(s) W is cut out therefrom using a wire saw, such that both surfaces of the cut-out wafer substrate W subsequently experiences wrapping.

Then, after the wafer substrate W experiences etching, both surfaces of the wafer substrate W are polished and the front surface of the wafer substrate W is further polished.

After completing the polish of the wafer substrate W, the wafer substrate W is cleaned by the above-described substrate cleaning apparatus 1. At the time of cleaning the substrate W, the aqueous solution of fluorinated acid, the concentration of which has been adjusted, is introduced into the bubbling tank 11 while nitrogen, the temperature of which has been adjusted by the gas heater 5, is introduced into the membrane filter 14, so that multiple bubbles are formed within the bubbling tank 11. With this operation, the fluorinated acid contained in the aqueous solution of fluorinated acid is vaporized together with the bubbles, so that the vaporized fluorinated acid is stored in the pressurizing tank 12.

The vaporized fluorinated acid is subsequently sprayed from the nozzle 16 with an opening degree of the air-operated valve 9 being adjusted, so that the front surface of the wafer substrate W is cleaned with fluorinated acid. At the time of cleaning the wafer substrate W, the nozzle 16 is rotated while the single-wafer spin cleaner 13 is also rotated, such that all the front surface of the wafer substrate W is uniformly cleaned. Cleaning of the substrate W with fluorinated acid is exemplarily conducted in such a manner that a gas containing fluorinated acid at a concentration of 10 mass % and having a temperature of 25 degrees C. is blown onto the substrate W for 2 minutes.

Figure 3:
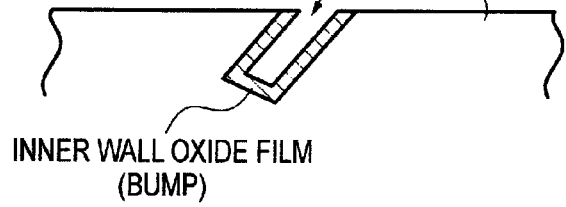
FIG. 3 is an illustration for explaining operation(s) according to the exemplary embodiment of the present invention.
Figure 3:
Figure 3:
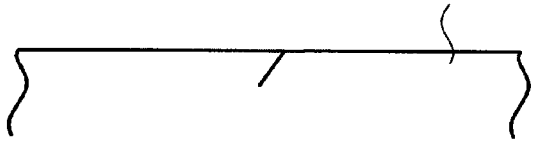
Figure 3:
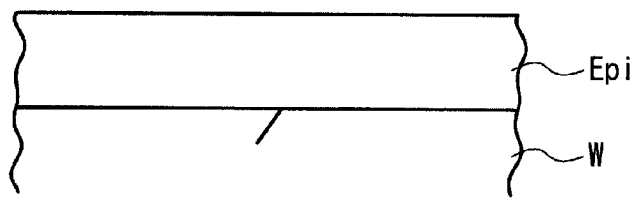

By cleaning the substrate W with the vaporized fluorinated acid, the oxide film nitride film covering the inner wall of the groove-shaped COP formed on the front surface of the wafer substrate W can be effectively eliminated as shown in FIG. 3.

Then, after the front surface of the substrate W is cleaned with fluorinated acid, an epitaxial layer Epi is formed on the front surface of the wafer substrate W.

At the time of forming the epitaxial layer Epi, the COP is completely shrunk by heat treating the substrate W under presence of hydrogen ($H_2$ Bake treatment), and the epitaxial layer Epi is subsequently formed using a typical epitaxial-layer growth system. The method of forming the epitaxial layer Epi is not subject to any specific limitations. A method such as hydrogen reduction method, pyrolysis method, metal organic chemical vapor deposition (MOCVD method) or molecular beam epitaxial method (MBE method) can be employed.

The oxide film.nitride film inside the COP formed on the surface of the wafer substrate W can be sufficiently eliminated by cleaning the surface of the wafer substrate W with fluorinated acid, thereby preventing stacking faults. With this arrangement, a manufacturing yield of the epitaxial silicon wafer substrate(s) can be considerably enhanced.

Example(s)

Next, Example(s) of the present invention will be described.

The epitaxial layer Epi was formed on the wafer substrate W the surface of which had been cleaned by the above-described cleaning apparatus 1 (Example 1), and generation of stacking faults was measured with a particle counter. Cleaning of the substrate W was conducted in such a manner that a gas containing fluorinated acid at a concentration of 10 mass % and having a temperature of 25 degrees C. was blown onto the substrate W for 2 minutes.

In order to confirm effect(s) of Example 1 above, epitaxial layers were formed on surfaces of a wafer substrate W not cleaned with fluorinated acid (Comparative 1), a wafer substrate W soaked in the aqueous solution of fluorinated acid (Comparative 2), and a wafer substrate W cleaned with the aqueous solution of fluorinated acid using the single-wafer spin cleaner (Comparative 3) respectively, and generation of stacking faults in the wafer substrates W each was measured with the particle counter as in Example 1. The results are shown in Table 1.

TABLE 1

| Cleaning Method | Number of Stacking Faults (pcs) |
|---|---|
| Example 1 | Cleaning with Vaporized Fluorinated Acid | 4 |
| Comparative 1 | No Cleaning with Fluorinated Acid | 128 |
| Comparative 2 | Cleaning by Soaking in Fluorinated Acid | 98 |
| Comparative 3 | Cleaning with Fluorinated Acid by Single-Wafer Spinning | 80 |

As is understood from Table 1, it has been found that the number of stacking faults in Example 1 is considerably decreased as compared with that of Comparative 1, in which no cleaning with fluorinated acid was conducted. In addition, comparison of Example 1 with Comparative 2, in which the substrate was soaked in the aqueous solution of fluorinated acid, and Comparative 3, in which the substrate experienced the spin cleaning with the aqueous solution of fluorinated acid, also shows that the number of stacking faults in Example 1 is considerably decreased. Thus, it has been found that the generation of stacking faults can be prevented by adopting the manufacturing method of epitaxial silicon wafer according to the present invention.

The priority application Number JP 2007-160100 upon which this patent application is based is hereby incorporated by reference.

What is claimed is:

1. A method of manufacturing an epitaxial silicon wafer, the epitaxial silicon wafer comprising:
a substrate cut out from a silicon monocrystal, the silicon monocrystal being manufactured, doped with nitrogen, and pulled up in accordance with the Czochralski method; and an epitaxial layer formed on the substrate, the method comprising:
cleaning a surface of the substrate with fluorinated acid by spraying vaporized fluorinated acid onto the surface of the substrate to eliminate an oxide film.nitride film covering an inner wall of a crystal originated particle; and
forming the epitaxial layer on the cleaned surface of the substrate,
wherein in the cleaning, the fluorinated acid is sprayed onto the surface of the substrate by a nozzle, which is rotatable to change a position on the surface of the substrate onto which the fluorinated acid is sprayed from the nozzle, while rotating the substrate, and
wherein the cleaning the surface of the substrate comprises:
introducing into a tank an aqueous solution of the fluorinated acid, a concentration of which has been adjusted;
vaporizing the fluorinated acid by bubbling by introducing an inactive gas; and
pressurizing and spraying the vaporized fluorinated acid.

* * * * *